United States Patent
Leng et al.

(10) Patent No.: US 6,908,851 B2
(45) Date of Patent: Jun. 21, 2005

(54) CORROSION RESISTANCE FOR COPPER INTERCONNECTS

(75) Inventors: Yaojian Leng, Plano, TX (US); Linlin Chen, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/463,948

(22) Filed: Jun. 17, 2003

(65) Prior Publication Data

US 2004/0259352 A1 Dec. 23, 2004

(51) Int. Cl.$^7$ .......................................... H01L 21/4763
(52) U.S. Cl. ...................... 438/633; 438/625; 438/629; 438/645; 438/650; 438/687
(58) Field of Search .................................. 438/625, 629, 438/633, 645, 650, 687

(56) References Cited

U.S. PATENT DOCUMENTS

| | | | | |
|---|---|---|---|---|
| 5,695,810 A | * | 12/1997 | Dubin et al. | 427/96 |
| 6,153,043 A | | 11/2000 | Edelstein et al. | |
| 6,696,761 B2 | * | 2/2004 | Chan et al. | 257/762 |
| 6,713,875 B2 | * | 3/2004 | Farrar | 257/767 |

* cited by examiner

*Primary Examiner*—Christian Wilson
(74) *Attorney, Agent, or Firm*—Rose Alyssa Keagy; W. James Brady, III; Frederick J. Telecky, Jr.

(57) ABSTRACT

A method to reduce the copper corrosion of copper interconnects by forming 70 at least one conductive displacement plating layer on the copper interconnects. Also, a method to eliminate the copper corrosion of copper interconnects by forming 70 at least one conductive displacement plating layer on the copper interconnects.

25 Claims, 1 Drawing Sheet

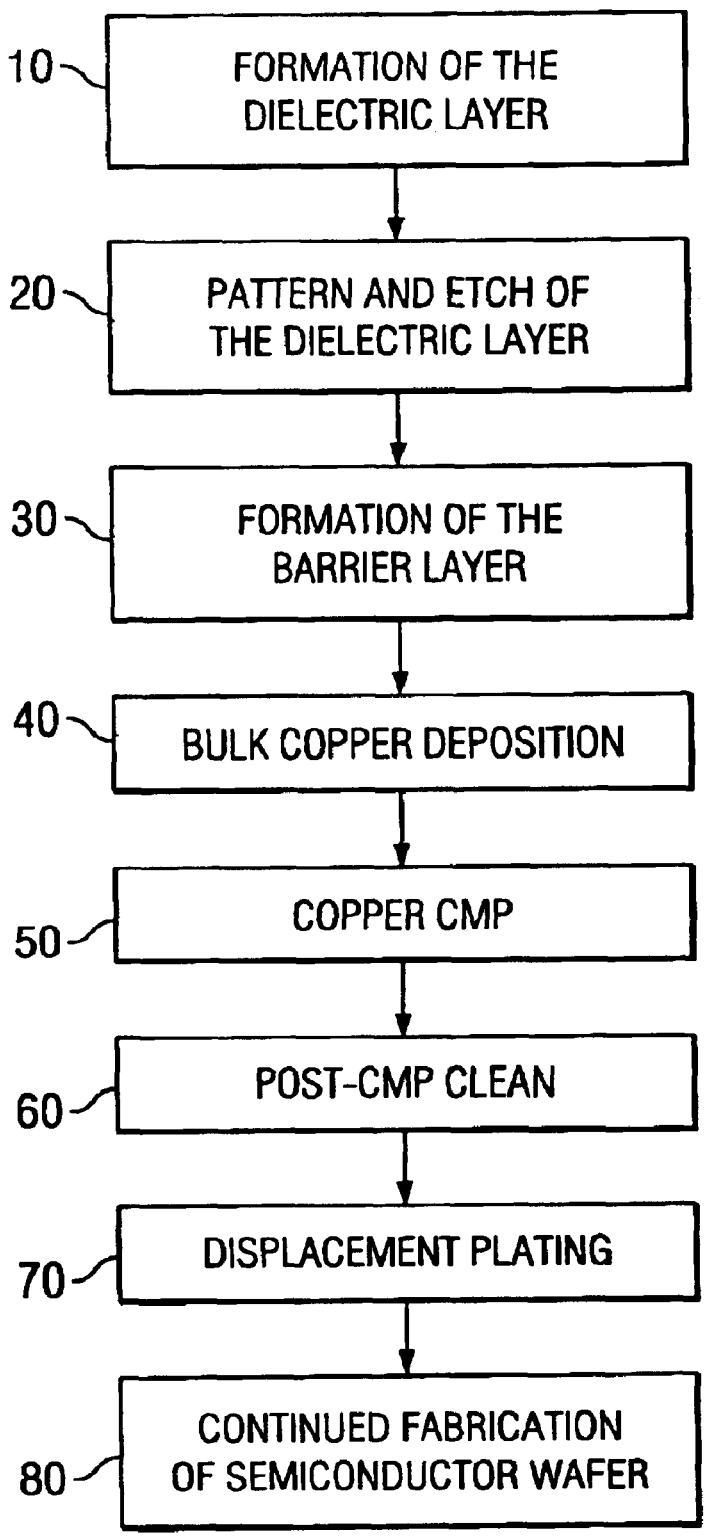

CORROSION RESISTANCE FOR COPPER INTERCONNECTS

FIELD OF THE INVENTION

This invention relates to the prevention of copper corrosion during the integrated circuit manufacturing process when copper is used as the interconnect material.

BACKGROUND OF THE INVENTION

As the performance of semiconductor integrated circuits improves, copper is replacing aluminum and becoming the material of choice for interconnects due to its lower resistivity and better electro-migration resistance. However, unlike aluminum which forms a native protective oxide layer, copper is more susceptible to corrosion. The copper corrosion can occur during the copper interconnect manufacturing processes due to its exposure to the chemical or ambient environment, and it can be further enhanced by the exposure to the light (photovoltaic effect) due to its connection to p-n junctions on the wafer. The copper corrosion usually happens between copper CMP, where a flesh copper surface is exposed, and the next process step, such as the passivation layer or etch stop layer (SiN, SiC) deposition. In the prior art, one way to reduce copper corrosion is through the use of corrosion inhibitor, such as Benzotriazole (BTA), in the manufacturing process.

The difficulty in using BTA for corrosion prevention is in controlling the applied amount due to the fact that the BTA applied during or post CMP process on the wafer surface has to be removed in the vacuum deposition tool prior to the application of the passivation layer. If the applied amount of BTA is not enough or the uniformity of the applied BTA layer is not good then the desired effect of corrosion prevention cannot be achieved. On the other hand, if too much BTA is applied to the wafer surface then it is very difficult to remove it completely before the next process step. BTA residue on the wafer will often cause defectivity and impact device yield and reliability. Additionally, the removal of BTA in the vacuum deposition tool has resulted in high maintenance costs and long tool down times. Another way to reduce copper corrosion, particularly the corrosion due to photovoltaic effect is to darken the environment during the manufacturing process. However, this increases the manufacture cost, is difficult to implement, and it does not completely eliminate corrosion. Yet another method to reduce copper corrosion is to impose a time window between copper CMP and the next process step. The controlled time delay between the two processes is simply to reduce as much as possible the exposure time of the copper interconnect to ambient environment to minimize the corrosion. This increases the manufacture cost and is difficult to implement; and yet it does not completely elimination copper corrosion. Hence, there is a need to further improve corrosion resistance of copper in the integrated circuits manufacturing process. Furthermore, it is highly desirable to replace the BTA with a layer or layers that can be applied more uniformly, have higher corrosion resistance than the copper interconnect, can selectively coat the copper interconnects, and does not need to be removed at the next passivation layer deposition.

BRIEF DESCRIPTION OF THE DRAWINGS

The drawing is a flow chart illustrating the process flow of the present invention.

DETAILED DESCRIPTION OF THE INVENTION

The use of displacement plating to selectively coat copper interconnects with higher corrosion resistant metal or metal alloy layers during the manufacturing process of copper interconnects will minimize the occurrence of copper interconnect corrosion. The present invention is described with reference to the attached FIGURE. The FIGURE is not drawn to scale and it is provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

The drawing is a flow chart illustrating the process flow of the present invention. The present invention is used during the fabrication of an integrated circuit. Due to the difficulty of etching copper in plasma etch chamber, the damascene process is typically used to create copper wiring. In the damascene process, openings in the dielectric insolating layer are formed with a patterning and etching process. In a single damascene structure, the openings are trench or via, and in a dual damascene structure, the openings are usually trench plus via. However, a dual damascene structure could be several trenches or several vias to a trench. These openings are then coated with a barrier layer, such as Ta, TaN, to prevent copper diffusion into the dielectric layer and to improve adhesion between the copper interconnect and the dielectric layer, followed by the formation of the copper seed layer. The openings are then filled with bulk copper through, for example, an electroplating process. The chemical mechanical polishing (CMP) process is then used to remove excess portions of copper and to planarize the surface. The polished wafers are then cleaned to remove slurry, polishing by-product, and corrosion inhibitors. The corrosion inhibitors generally protect the copper surface during CMP and post CMP clean. However, after post CMP clean, when the corrosion inhibitor has been removed from the wafer surface, it is found that copper is particularly susceptible to corrosion.

After post CMP clean, the copper surface is exposed within the fabrication environment. Copper is susceptible to corrosion in such an ambient environment. The issue is further aggravated by photo induced copper corrosion. The exposure of the P-N junctions to light causes the photo induced copper corrosion/re-deposition due to the photovoltaic effect since the copper is connected to the P-N junction. Such events may result in yield loss and reliability problems.

The problem of corrosion can be reduced or eliminated by forming a higher corrosion resistant layer or layers with a displacement plating process at the top surface of the copper interconnects. It is within the scope of this invention to use any displacement metal or alloy for the coating layers. For example, the metal used for the displacement plating layers may be Palladium, Platinum, Rhodium, Ruthenium, Gold, Silver, Lead, Nickel, Cadmium, Tin, or other noble metals and their alloys.

The advantage of the current invention in preventing copper corrosion is multifaceted. First, the displacement metal (such as Pd) is selectively coated on the top surface of copper, not in other places, such as dielectric layer. Second, since the coating itself is conductive; it does not need to be removed in a later process step. Third, the thickness of the displacement plating is driven by the oxidation potential difference between the coating metal and copper, therefore its thickness is self-limiting and the final thickness can be well controlled. Fourth, the coating process has excellent coverage, therefore uniform corrosion resistant layers can be applied on top of the copper interconnects.

In the best mode application, it's desirable to have a monolayer of corrosion resisting metal as the displacement plating layer. However, any thickness that can provide sufficient corrosion prevention of the copper interconnect—without significantly increasing metal resistance—is within the scope of the invention. In the best mode application, the thickness of displacement metal is below 100 Å for a trench depth around 2000 Å to 5000 Å.

Referring again to the drawing, a dielectric layer is formed (step 10) over the entire wafer during the fabrication of the interconnect structure. The dielectric material may be applied to the substrate with a Chemical Vapor Deposition ("CVD") or a spin-on manufacturing process. The dielectric layer is then patterned (using photoresist) and etched (step 20) to form a trench and/or via for the copper interconnects. A barrier metal (such as Ta, TaN or TaN/Ta bilayer) is deposited (step 30) to prevent copper diffusion into the dielectric layer and also to improve the adhesion between the copper interconnect and the dielectric layer, and is followed by the copper seed. Then bulk copper is deposited (step 40) onto the wafer to fill trenches and/or vias typically through an electrochemical deposition process. A Chemical Mechanical Polishing (CMP) process is used to remove the excessive copper and to planarize the surface (step 50).

A post-CMP clean (step 60) is then performed to remove slurry residues, corrosion inhibitors, such as Benzotriazole ("BTA"), and other by-products from the polished surface. The post-CMP clean is typically first performed in a megasonic cleaner using Tetramethyl Ammonium Hydroxide ("TMAH") as the cleaning agent. That is followed by brush clean using chemical agent, such as ammonium citrate.

In accordance with the invention, a coating of displacement plating is now formed (step 70) on the metal interconnects. In the best mode application, an immersion into the displacement plating solution can be utilized to subject the semiconductor wafer to the displacement reaction. However, other displacement plating processes such as spraying the displacement plating solution on to the wafer surface is also within the scope of this invention. In the example application the displacement plating process is performed using the same clean-up hood as the Post-CMP clean processes in order to prevent corrosion during wafer transfer.

The displacement reaction process forms a self-limiting passivation layer on all exposed copper surfaces However, various thicknesses of displacement plating are within the scope of this invention. For example, if a very thin coating of plating is desired then the plating process may be discontinued before the displacement reaction becomes self-limited; or a different displacement plating solution with lower metal concentrations can be used. The plating process may even be modified to create thick coats of plating. In the best mode application the thickness of displacement plating layer is determined by the requirements of minimized corrosion occurrence of copper interconnect. The thickness of the displacement plating depends on the plating solution concentration and the displacement reaction time. Example displacement plating solutions are: a) cadmium oxide and potassium hydroxide, b) hydrogen tetrachloroaurate ethanol, c) lead monoxide and sodium cyanide and sodium hydroxide, d) nickel sulfate and ammonium nickel sulfate and sodium thiosulfate, e) palladium chloride and hydrochloric acid, f) chloroplatinic acid and hydrochloric acid, g) rhodium sulfate and sulfuric acid, h) ruthenium nitrosyl chloride and hydrochloric acid, i) silver nitrate and ammonia and sodium thiosulfate, or j) stannous chloride and thiourea and sulfuric acid. However, other plating solutions are within the scope of this invention. The selection of the displacement solutions is dependent on the metal or metal alloy layers and its compatibility with semiconductor manufacturing processes.

It should be noted that the displacement plating process only coats the copper area. That is because the copper displaces the noble metal from its solution causing only the metal interconnects to be coated. As an example, if the metal interconnects contain copper and the displacement plating solution contains palladium then the displacement reaction would generally be: $Cu+Pd^{2+} \rightarrow Cu^{2+}+Pd$. The result is that palladium will be selectively coated on top of the copper interconnect.

The fabrication process now continues until the interconnect structure is complete (step 80). It should be noted that it is within the scope of this invention to form displacement plating on the metal interconnects of any interconnect layer.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for reducing the copper corrosion of copper interconnects during fabrication of a copper interconnect structure of a semiconductor wafer comprising:

forming a patterned dielectric layer over said semiconductor wafer;

depositing a copper layer over said patterned dielectric layer;

performing a CMP process to form said copper interconnects; and forming a conductive displacement plating layer on a top surface of said copper interconnects.

2. The method of claim 1 wherein said conductive displacement plating layer includes a corrosion resistant metal.

3. The method of claim 2 wherein said corrosion resistant metal is palladium.

4. The method of claim 2 wherein said corrosion resistant metal is platinum.

5. The method of claim 1 wherein said forming step includes immersing said semiconductor wafer into a displacement plating solution.

6. The method of claim 1 wherein said forming step includes spraying a displacement solution onto said semiconductor wafer.

7. The method of claim 1 wherein said conductive displacement plating layer is a monolayer.

8. The method of claim 1 wherein said conductive displacement plating layer is less than 100 Å thick.

9. The method of claim 1 wherein said conductive displacement plating layer includes a corrosion resistant metal alloy.

10. A method for reducing the copper corrosion of copper interconnects during fabrication of a copper interconnect structure of a semiconductor wafer comprising:

forming at least two conductive displacement plating layers on a top surface of said copper interconnects.

11. The method of claim 10 wherein said at least two conductive displacement plating layers includes a corrosion resistant metal.

12. The method of claim 11 wherein said corrosion resistant metal is palladium.

13. The method of claim 11 wherein said corrosion resistant metal is platinum.

14. The method of claim 10 wherein said forming step includes immersing said semiconductor wafer into a displacement plating solution.

15. The method of claim 10 wherein said forming step includes spraying a displacement solution onto said semiconductor wafer.

16. The method of claim 10 wherein said at least two conductive displacement plating layers are less than 100 Å thick.

17. The method of claim 10 wherein said at least two conductive displacement plating layers includes a corrosion resistant metal alloy.

18. A method for eliminating the copper corrosion of copper interconnects during fabrication of a copper interconnect structure of a semiconductor wafer comprising:

forming a patterned dielectric layer over said semiconductor wafer;

depositing a copper layer over said patterned dielectric layer;

performing a CMP process to form said copper interconnects; and forming at least one conductive displacement plating layer on a top surface of said copper interconnects.

19. The method of claim 18 wherein said at least one conductive displacement plating layer includes a corrosion resistant metal.

20. The method of claim 19 wherein said corrosion resistant metal is palladium.

21. The method of claim 19 wherein said corrosion resistant metal is platinum.

22. The method of claim 18 wherein said forming step includes immersing said semiconductor wafer into a displacement plating solution.

23. The method of claim 18 wherein said forming step includes spraying a displacement solution onto said semiconductor wafer.

24. The method of claim 18 wherein said at least one conductive displacement plating layer is less than 100 Å thick.

25. The method of claim 18 wherein said at least one conductive displacement plating layer includes a corrosion resistant metal alloy.

* * * * *